United States Patent [19]

De León, II et al.

[11] Patent Number: 5,553,014

[45] Date of Patent: Sep. 3, 1996

[54] ADAPTIVE FINITE IMPULSE RESPONSE FILTERING METHOD AND APPARATUS

[75] Inventors: Phillip L. De León, II, Berthoud, Colo.; Dennis R. Morgan, Morristown, N.J.

[73] Assignee: Lucent Technologies Inc., Murray Hill, N.J.

[21] Appl. No.: 332,224

[22] Filed: Oct. 31, 1994

[51] Int. Cl.$^6$ ................................................ G06F 15/31
[52] U.S. Cl. ................................................ 364/724.19
[58] Field of Search ................................ 364/724.19, 602, 364/574; 370/32.1; 379/406, 410, 411; 367/901

[56] References Cited

U.S. PATENT DOCUMENTS

| | | |
|---|---|---|
| 5,014,263 | 5/1991 | Vairavan et al. . |
| 5,136,577 | 8/1992 | Amano et al. . |
| 5,187,692 | 2/1993 | Haneda et al. . |
| 5,263,019 | 11/1993 | Chu . |
| 5,272,695 | 12/1993 | Makino et al. . |
| 5,278,780 | 1/1994 | Eguchi . |
| 5,388,080 | 2/1995 | Feintuch et al. ................ 367/901 |
| 5,418,848 | 5/1995 | Armbrüster ........................ 379/406 |

Primary Examiner—Tan V. Mai

[57] ABSTRACT

A signal processing method and apparatus including a digital finite impulse response filter wherein the error caused by slow asymptotic convergence of the filter's adaptive coefficients is reduced. A first input signal is provided to an adaptive FIR filter including a coefficient calculator, finite impulse response FIR filter and a summation device. The filter also receives a second input signal, which may, for example, be the echo of the first input signal. The first input signal and the second input signal have a first bandwidth. The adaptive FIR filter then provides an output signal to a filter, which then filters the output signal to a second bandwidth which is less than the first bandwidth. The processed signal will have less error caused by the slow asymptotic convergence of the filter than previously possible because the error-concentrated frequency components near the band edge of the first frequency band have been filtered or removed.

36 Claims, 8 Drawing Sheets

5,553,014

ADAPTIVE FINITE IMPULSE RESPONSE FILTERING METHOD AND APPARATUS

FIELD OF THE INVENTION

The present invention relates generally to the field of adaptive finite impulse response filters and, more particularly, to signal processing devices employing such filters.

BACKGROUND OF THE INVENTION

As full-duplex hands-free communication has become ever more widespread, attention has been focussed on the problem of acoustic echoes that result from coupling between loudspeakers and microphones. Acoustic echo cancellers are now commonly used in such systems to reduce this undesired effect. An acoustic echo canceller (AEC) derives an estimate of the echo using a finite impulse response (FIR) filter with adjustable or adaptive coefficients to model the response of the acoustic coupling path. The estimated echo signal may then be subtracted from the undesired echo signal, which substantially cancels the echo.

A similar technique is also used in line echo cancellation. In line echo cancellation applications, however, the unwanted echo signal is created by communication circuit anomalies, such as cross-talk.

In both of these echo cancellation applications, the adaptive coefficients of the FIR filter are derived from the input signal and the echo signal using a version of the known least-mean-square (LMS) algorithm, owing to its simplicity of implementation and robust operation. The LMS algorithm uses iterative techniques to minimize the square of the error signal, which is the difference between the actual echo signal and the estimated echo signal produced by the FIR filter.

The use of adaptive filters, as opposed to fixed filters, allows echo cancellers to respond to changes in the echo creating environment. Consider an FIR filter used in an AEC application. Without the use of adaptive coefficients, the impulse response of the acoustic echo path must be estimated and then appropriate filter coefficients must be permanently programmed. Because of variations in room acoustics due to changes in furniture configuration, occupancy, or microphone or speaker placement, a set of permanently programmed coefficients for the FIR filter will not necessarily provide the best echo cancellation.

Adaptive filters, however, also have problems that limit their performance. A particular problem associated with known adaptive FIR filters is the slow convergence of the LMS algorithm. Convergence speed is measured by the amount of time, or number of samples, it takes for the LMS algorithm to generate a set of coefficients that best represents the echo path response. Until the LMS algorithm converges, the error signal will exceed its minimum value. Slow convergence, therefore, detrimentally prolongs the duration of the non-minimum error signal. The slow convergence problem has been noted in several publications and patents including U.S. Pat. Nos. 5,014,263 and 5,263,019, which are incorporated by reference herein.

Prior solutions to the problem of slow convergence include the addition of a whitening filter to broaden the spectrum of the adaptive filter's input signal. After broadening the spectrum, the adaptive FIR filter then performs the echo cancellation. An inverse whitening filter is then provided to remove the broadening effects. This solution, however, while initially increasing the rate of convergence, does not appreciably alleviate the slow convergence as the error approaches the minimum.

The slow convergence that is experienced as the error signal approaches its minimum is referred to as slow asymptotic convergence. One reason prior art solutions have not successfully reduced the error due to slow asymptotic convergence of adaptive filters using the LMS algorithm is that there has been insufficient knowledge as to its cause and character.

SUMMARY OF THE INVENTION

The present invention provides an improved adaptive FIR filter-based signal processing apparatus that reduces error resulting from slow asymptotic convergence. It has been found both experimentally and theoretically that the slow asymptotic convergence of the LMS algorithm is associated with a significant concentration of error energy at frequencies approaching the band edge of signals processed by the adaptive filter. The present invention improves the slow asymptotic convergence problem by removing the frequency band edge components which disproportionately contribute to the mean squared error during convergence.

In one embodiment of the present invention, a first digital input signal is provided to an adaptive FIR filter comprising a coefficient calculator, an FIR filter, and a summation device. The adaptive FIR filter also receives a second digital input signal, which may, for example, be an echo of the first digital input signal. The first digital input signal and the second digital input signal have a first operational bandwidth. The adaptive FIR filter then processes the two input signals and provides an output signal to the system. The system, however, only uses the portion of the output signal that is within a second operational bandwidth. The second operational bandwidth is less than the first operational bandwidth. To this end, the frequency components near the band edge of the first operational bandwidth may suitably be removed by filtering. In any event, the system experiences reduced levels of error resulting from slow asymptotic convergence of the adaptive filter because the error-concentrated frequency components are outside the second operation bandwidth.

The above system can be used to alleviate errors resulting from slow asymptotic convergence of the LMS algorithm in an adaptive FIR filter employed in echo cancellation systems, tonal filters, and other systems, as will be apparent to those of ordinary skill in the art.

The above discussed features, as well as additional features and advantages of the present invention, will become more readily apparent by reference to the following detailed description and the accompanying drawings.

DETAILED DESCRIPTION

Figure 1:
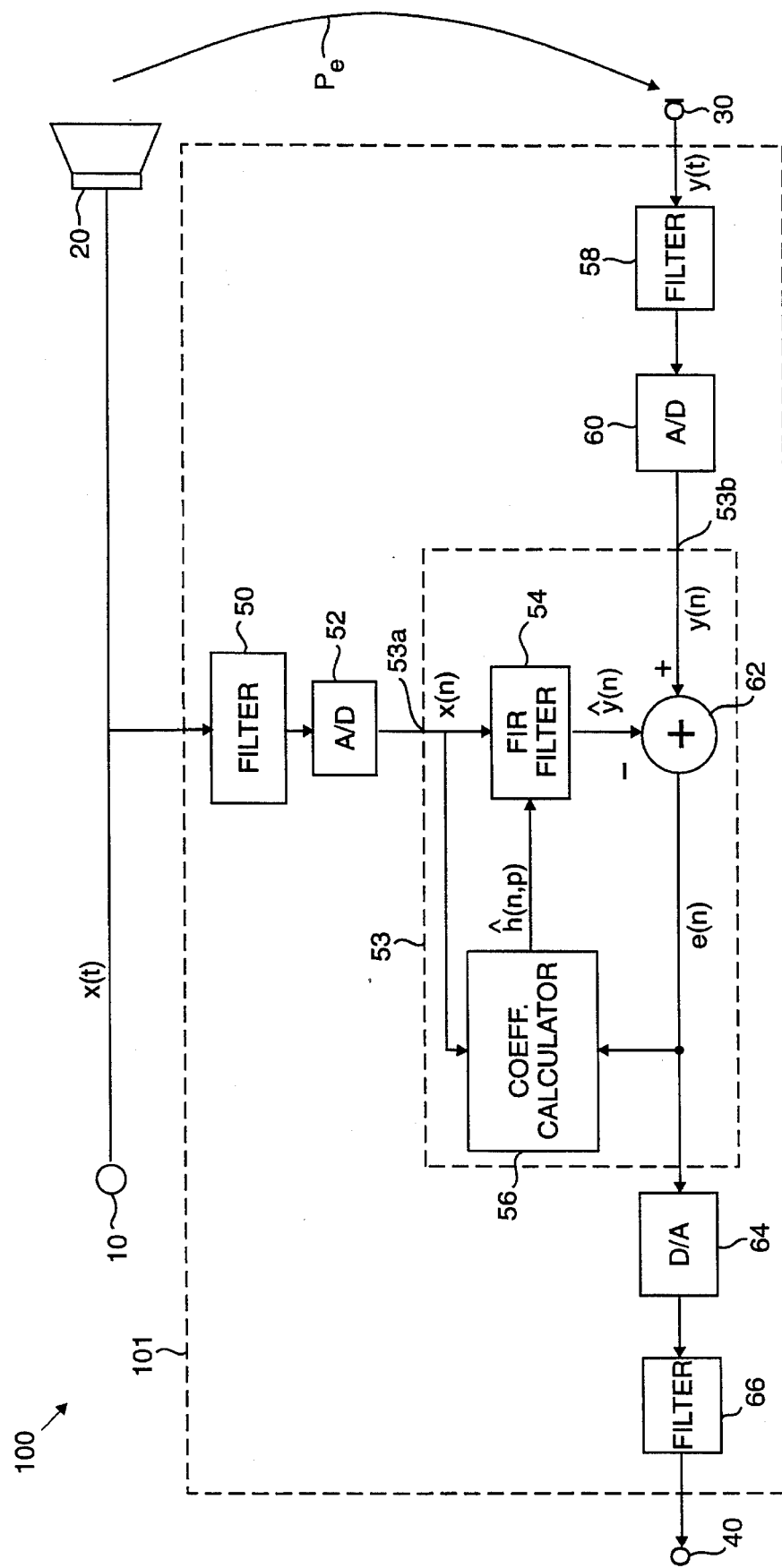
FIG. 1 illustrates a block diagram of a full-duplex hands-free communication system including an acoustic echo cancellation apparatus according to the present invention.

FIG. 1 illustrates a block diagram of a system 100 employing an echo cancellation apparatus 101 operating according to the present invention. The echo cancellation apparatus 101 is shown as part of a full-duplex hands-free telecommunication system 100. The hands-free telecommunication system 100 may suitably be a mobile telephone or desk top speaker phone. The implementation of the echo cancellation apparatus 101 in the system 100 is given by way of example only. The apparatus 101 may readily be implemented in other acoustic echo cancellation contexts by those of ordinary skill in the art.

The system 100 includes a telephone signal input 10, a loudspeaker 20, a microphone 30, a telephone signal output 40, and the echo cancellation apparatus 101. The apparatus 101 further includes first and second anti-aliasing filters 50 and 58, first and second analog-to-digital (A/D) converters 52 and 60, a digital-to-analog (D/A) converter 64, a reconstruction filter 66, and an adaptive FIR filter 53. The adaptive filter 53 further comprises a programmable FIR filter 54, an adaptive coefficient calculator 56 and a summation device 62.

In general, the input 10 is connected to the loudspeaker 20. The loudspeaker 20 and the microphone 30 serve as the interface in which a user may receive and provide telephone speech signals. The microphone is connected to the output 40 through a part of the echo cancellation apparatus 101 as described further below. The echo cancellation apparatus 101 is employed to reduce the echo that results from acoustic coupling between the loudspeaker 20 and the microphone 30.

The echo cancellation apparatus 101 is implemented within the system 100 as follows. The input 10 is connected to the first anti-aliasing filter 50, which is, in turn, connected to the A/D converter 52. The filter 50 may suitably be a low pass filter having a cut-off frequency at a first frequency which is higher, preferably by between 10 and 25 percent, than the cut-off of the frequency band of interest. The frequency band of interest is a predetermined frequency band in which the system 100 ordinarily processes signals. The frequency band of interest may, in some circumstances, be dictated by industry standards. For example, a telephone network typically has a frequency band of interest of approximately 3.5 kHz. Consequently, in such a system, the filter 50 would have a cut-off frequency exceeding 3.5 kHz, such as 4.0 kHz. The filter cut-off frequency is normally defined as the frequency at which a filter provides −3 dB of attenuation.

The A/D converter 52 has a sampling rate which exceeds twice the cut-off frequency of the filter 50 in order to reduce the aliasing error associated with A/D conversion. Preferably, the A/D converter 52 has a sampling rate which is at least twice the frequency at which the filter 50 exhibits −70 dB of attenuation. This choice of sampling rate substantially reduces the aliasing error as is well known in the art. It is noted that the sampling rate required may be reduced by increasing the order of the filter 50. Those of ordinary skill in the art would be readily able to match the A/D converter 52 and the filter 50 to reduce such aliasing error for a particular application.

The A/D converter 52 is further connected to both the FIR filter 54 and the coefficient calculator 56 through a first input 53a of the adaptive FIR filter 53. The coefficient calculator 56 has an additional connection to the FIR filter 54. The FIR filter 54 is also connected to an input of the summation device 62. The summation device 62 also has an output which is connected to the coefficient calculator 56. The adaptive FIR filter 53 is described in further detail below in connection with FIG. 2.

The remaining components of the AEC apparatus 101 are serially connected between the microphone 30 and the output 40. The microphone 30 is connected to the second A/D converter 60 through the second anti-aliasing filter 58. The second anti-aliasing filter 58 preferably has the same structure and operation as the first anti-aliasing filter 50. In particular, it is preferable that the second anti-aliasing filter 58 has a cut-off frequency at the first frequency. Likewise, the second A/D converter 60 has the same structure and function as the first A/D converter 52. The converter 60 is connected through a second input 53b of the adaptive FIR filter 53 to the summation device 62. The output of the summation device 62 is connected to the output 40 through the D/A converter 64 and the reconstruction filter 66. The filter 66 has a cut-off frequency at a second frequency which is lower than the first frequency, and preferably has a pass band more or less equivalent to the frequency band of interest of the system 100.

In general, a user employs the system illustrated in FIG. 1 to communicate over a telephone network, not shown. In particular, the user receives incoming telephone speech signals at the input 10, which are rendered audible by the loudspeaker 20. In addition, the user speaks into the microphone 30 which provides an analog signal to the output 40, which constitute outgoing telephone speech signals.

Under normal, non-ideal circumstances, a portion of the incoming telephone speech signal traverses the path $P_e$ from the loudspeaker 20 to the microphone 30, and is transmitted as part of the outgoing telephone signal. This portion of the outgoing signal constitutes an undesirable echo signal. The echo cancellation apparatus 101 removes a substantial portion of the echo signal in the following manner.

When an input speech signal x(t) is provided to the loudspeaker 20, it is also provided to the anti-aliasing filter 50. The anti-aliasing filter 50 removes the high frequency components of the analog signal that would otherwise produce aliasing errors in the A/D conversion. The filtered signal x(t) is then sampled by the A/D converter 52, producing a first digital input signal x(n) having a first operational frequency band that exceeds the frequency band of interest of the system. The frequency band of x(n), or in other words, the range of analog frequencies that the signal x(n) meaningfully represents, is determined by the cut-off frequency of the first anti-aliasing filter 50. The first input signal x(n) is then provided to the first input 53a of the adaptive FIR filter 53.

While the first input signal x(n) is received at the first input 53a, the input speech signal x(t) audibly traverses the path $P_e$, which acts as a filter having a time varying impulse response, H(t). The traversal of x(t) through the echo path $P_e$ produces a signal y(t) at the microphone 30. The microphone 30 then provides y(t) to the second anti-aliasing filter 58. The second filter 58 filters y(t) and provides the resulting signal to the A/D converter 60. The A/D converter 60 samples the filtered y(t), producing a second digital input signal y(n) having the same frequency band as x(n). The second input signal y(n) is then provided to the second input 53b of the adaptive FIR filter 53.

The adaptive FIR filter 53 then processes the two digital input signals x(n) and y(n). In general, the FIR filter 54 receives the digital input signal x(n) and produces an estimated echo signal ŷ(n), which it provides to the summing device 62. To this end, the FIR filter 54 has an impulse response that simulates the response of the path $P_e$ between the loudspeaker 20 and the microphone 30. The impulse response of the FIR filter 54 is represented by a series of P filter coefficients ĥ(n,p) where p=0 to P−1, also referred to as simply Ĥ(n). The FIR filter coefficients, Ĥ(n), are iteratively calculated by the coefficient calculator 56 and provided to the FIR filter 54. The use of the filter coefficients is also discussed further below in connection with FIG. 2.

The summation device 62 then subtracts ŷ(n) from y(n), producing an error signal e(n). If the FIR filter 54 has properly estimated the impulse response H(t) of the path Pe, then the error signal e(n) will be greatly attenuated if not substantially eliminated. The error signal e(n) is then provided to the D/A converter 64 where it is converted back into an analog signal. The reconstruction or smoothing filter 66 thereafter removes high frequency components created by the D/A conversion process.

Additionally, because the filter 66 has a lower cut-off frequency than the anti-aliasing filters 50 and 58, such filtering produces an output signal with a narrower operational frequency band than those of the input signals x(n) and y(n). As a result, the filter 66 also serves to remove some or all of the frequency components of the output signal that exceed the frequency band of interest of the system 100.

The adaptive FIR filter 53 also employs the error signal e(n) to adjust the filter coefficients Ĥ(n). To this end, the summation device 62 also provides the signal e(n) to the coefficient calculator 56. The coefficient calculator 56 then uses e(n) in conjunction with the first input signal x(n) to calculate the next iteration of coefficients, Ĥ(n+1), for use in processing the next sample x(n+1). The coefficient calculator 56 uses the known LMS algorithm to calculate the coefficients. The coefficient calculator then provides Ĥ(n+1) to the FIR filter 54.

The above system 100 thus estimates the echo signal y(n) by providing the input signal x(n) to an FIR filter having an impulse response that approximates the echo path $P_e$. The impulse response coefficients Ĥ(n) of the adaptive FIR filter are generated iteratively using the LMS algorithm. In prior art adaptive filters, however, due to the slow asymptotic convergence of the LMS algorithm, the error signal e(n) remained above its asymptotic minimum for a substantial amount of time. As a result, the ability of the filter to adapt quickly was inhibited.

It has been determined both theoretically and experimentally that the slow asymptotic convergence of the LMS algorithm in the adaptive digital filter is associated with a disproportionate amount of error energy at frequencies approaching the band edge. Thus for example, for an input digital signal having an operational frequency band of 3.5 kHz, the error energy is concentrated at frequencies in close proximity to 3.5 kHz. If, however, the same input signals have an operational frequency band of 4.0 kHz instead of 3.5 kHz, then the error energy will be concentrated in close proximity to 4.0 kHz.

Accordingly, this embodiment of the present invention expands the frequency band of the adaptive FIR filter input signals beyond the system's frequency band of interest. This is accomplished by selecting first and second anti-aliasing filters 50 and 58 that have a cut-off frequency greater than the highest frequency in the band of interest of the system.

As a result, the error energy that is associated with slow asymptotic convergence is concentrated at frequencies near the expanded band edge of the digital output signal e(n), which is outside the system frequency band of interest. The output signal is then filtered by the reconstruction filter 66, which cuts off or shaves the unwanted error-concentrated frequency components. It is to be noted that the use of the reconstruction filter 66 to shave the excess frequency components is given by way of example only. To this end, other suitable low pass filters, digital or analog, may be employed for the same purpose.

Figure 2:
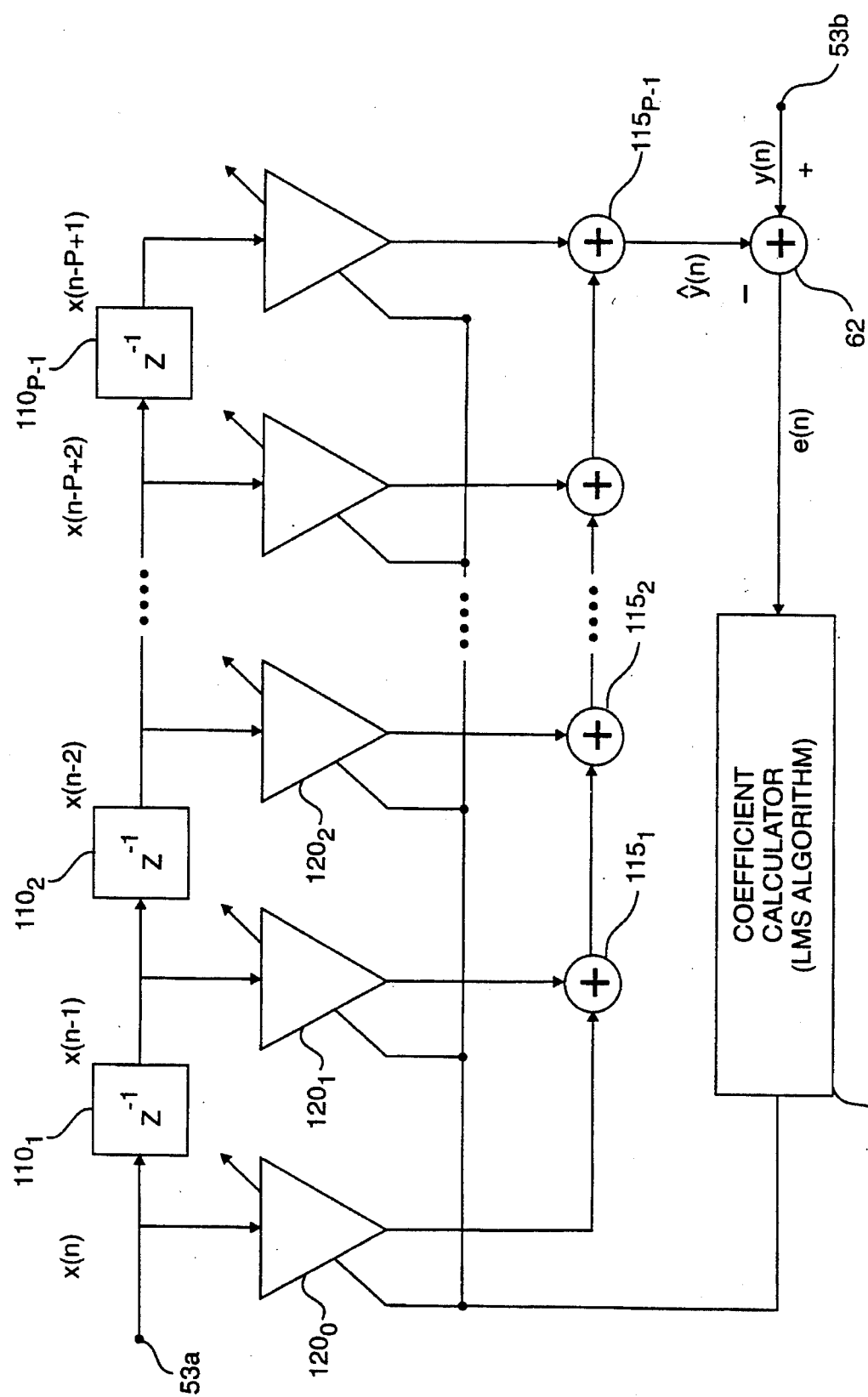
FIG. 2 illustrates a prior art adaptive digital finite impulse response filter suitable for use in the system of FIG. 1.

FIG. 2 illustrates an exemplary adaptive FIR filter which may be employed as the filter 53 in the echo cancellation system described above. The filter 53, however, may also be used in a number of other environments wherein the slow convergence of the LMS algorithm in an adaptive FIR filter inhibits the performance of a system.

The filter 53 has P taps, which means it has P coefficients. The filter includes P−1 delay elements $110_1$ through $110_{P-1}$ that are connected in series, P−1 adders $115_1$ through $115_{P-1}$ that are connected in series, and P multipliers $120_0$ through $120_{P-1}$. Each multiplier $120_K$ is connected to the output of a corresponding delay element $110_K$ with the exception of the first multiplier $120_0$, which is connected to the filter's first input 53a. Each multiplier $120_K$ is further connected to the corresponding adder $115_K$ with the exception of the first multiplier $120_0$, which is connected to the first adder $115_1$. The summing device 62 is connected to the second input 53b, the last adder $115_{P-1}$, and the coefficient calculator 56. The calculator 56 is connected to each of the multipliers $120_0$ through $120_{P-1}$. Adaptive filters of this type are generally well known in the art, and may be implemented by discrete circuitry or in a programmed digital signal processing device.

In general, the filter 53 operates with a first digital input signal x(n) and a second digital input signal y(n) to develop impulse response coefficients Ĥ(n) that approximate the relationship between the two signals. According to the present invention, the operational frequency bands of both x(n) and y(n) are greater than the frequency band of interest of the system into which the filter 53 is implemented. The operational frequency bands of x(n) and y(n) may be controlled during the A/D conversion process by means external to the adaptive filter 53. In particular when input analog signals are filtered and sampled, the filtering and sampling should be effectuated at a frequency exceeding the frequency band of interest, as was the case in the system illustrated in FIG. 1. As a result, the digital signals x(n) and y(n) should have an operational bandwidth exceeding the frequency band of interest.

Given this signal bandwidth constraint, the adaptive FIR filter operates in the following manner. When the first input signal x(n) is provided to the first input 53a and the second input signal y(n) is provided to the second input 53b, the adaptive digital filter 53 operates in a known manner to convert x(n) into an approximation of y(n) by implementing a well known FIR equation:

$$\hat{y}(n) = \sum_{p=0}^{P-1} \hat{h}(n,p)x(n-p)$$

To this end, before the signal x(n) is received at the input $53a$, the delay elements $110_1$ through $110_{P-1}$ each store or hold one of the prior P−1 samples of the first input signal such that the delay element $110_1$ holds the sample x(n−1), the delay element $110_2$ holds the sample x(n−2), and so forth. Furthermore, the multipliers $120_0$ through $120_{P-1}$ hold the prior set of P tap coefficients, $\hat{h}(n-1,p)$ where p=0 to P−1, such that the multiplier $115_0$ holds $\hat{h}(n-1,0)$, the multiplier $115_1$ holds $\hat{h}(n-1,1)$, and so forth.

To process the next sample, x(n), the coefficient calculator 56 first provides the nth set of coefficients $\hat{h}(n,p)$ for p=0 to P−1, or simply $\hat{H}(n)$, to the multipliers $120_0$ through $120_{P-1}$, replacing the previous set, $\hat{H}(n-1)$. The next sample x(n) is then provided to the multiplier $120_0$. At the same time, the delay elements provide x(n−1) through x(n−P+1) to the multipliers $120_1$ through $120_{P-1}$ respectively. Each multiplier $120_p$ then provides the product $\hat{h}(n,p) x(n-p)$ to the corresponding adder $115_p$. The adders $115_1$ through $115_{P-1}$, being serially connected, generate a running sum until the last adder $115_{P-1}$ contains the signal $\hat{y}(n)$, as given by the equation discussed above.

The adder $115_{P-1}$ then provides $\hat{y}(n)$ to the summation device 62 where it is subtracted from the second digital input signal, y(n), to give the error signal, e(n). The coefficient calculator 56 then employs x(n) and e(n) to calculate the next set of coefficients, $\hat{H}(n+1)$, as discussed below.

For subsequent input samples, x(n+1) and so forth, the above coefficient sequence, $\hat{h}(n,p)$ for p=0 to P−1, is updated by the coefficient calculator 56. The coefficient calculator 56 adjusts the coefficients using the LMS algorithm which is known. An exemplary LMS algorithm is given by the following equation, which is applicable for each coefficient:

$$\hat{h}(n+1,p) = \hat{h}(n,p) + \mu x(n-p) e(n)$$

where μ represents the step value. The step value determines the extent to which the current coefficients are affected by the next iteration. The step value may suitably be constant or adaptive. Various suitable methods of determining the step value for the LMS algorithm used in adaptive FIR filters are known to those of ordinary skill in the art and are discussed, for example, in U.S. Pat. No. 5,272,695, which is incorporated by reference herein. According to the LMS algorithm, the coefficient sequence $\hat{H}(n)$ is continually updated. With each update or iteration, $\hat{H}(n)$ should provide a better approximation of the relationship between x(n) and y(n). If so, it is said to be converging.

The output of the filter 53 may suitably be e(n), $\hat{y}(n)$ or $\hat{H}(n)$, depending on the filter's application. The signals e(n) and $\hat{y}(n)$, as well as the coefficient sequence $\hat{H}(n)$, have an operational frequency band that is dependent on the input signals x(n) and y(n), and thus exceeds the system frequency band of interest. According to the present invention, the system does not utilize the frequency components of the output signal that exceed the system's frequency band of interest. In this manner, the error energy that normally concentrates at the band edges does not affect the frequency band of the system in which the adaptive filter 53 is implemented.

Any system in which an adaptive FIR filter is used may benefit from the techniques of the present invention. For example, a system similar to that described in FIG. 1 employs the techniques of the present invention to improve a line echo canceller. Line echo cancellers operate in generally the same manner as acoustic echo cancellers with the exception being the source of the echo signals. In AEC, the echo signals result from coupling between the speaker 20 and the microphone 30. In line echo cancellation, the echo signals result from coupling between wires in a communication network, also called cross-talk, as well as other non-ideal components of the network. The system in FIG. 1 may readily be modified by those of ordinary skill in the art to perform line echo cancellation.

To this end, the loudspeaker 20, the microphone 30 in FIG. 1 are replaced by a communication network having a line echo time varying impulse response, H(t). Otherwise, the line echo canceller is the same as the acoustic echo cancellation apparatus 101 illustrated in FIG. 1, and is implemented in the same manner.

Figure 3:
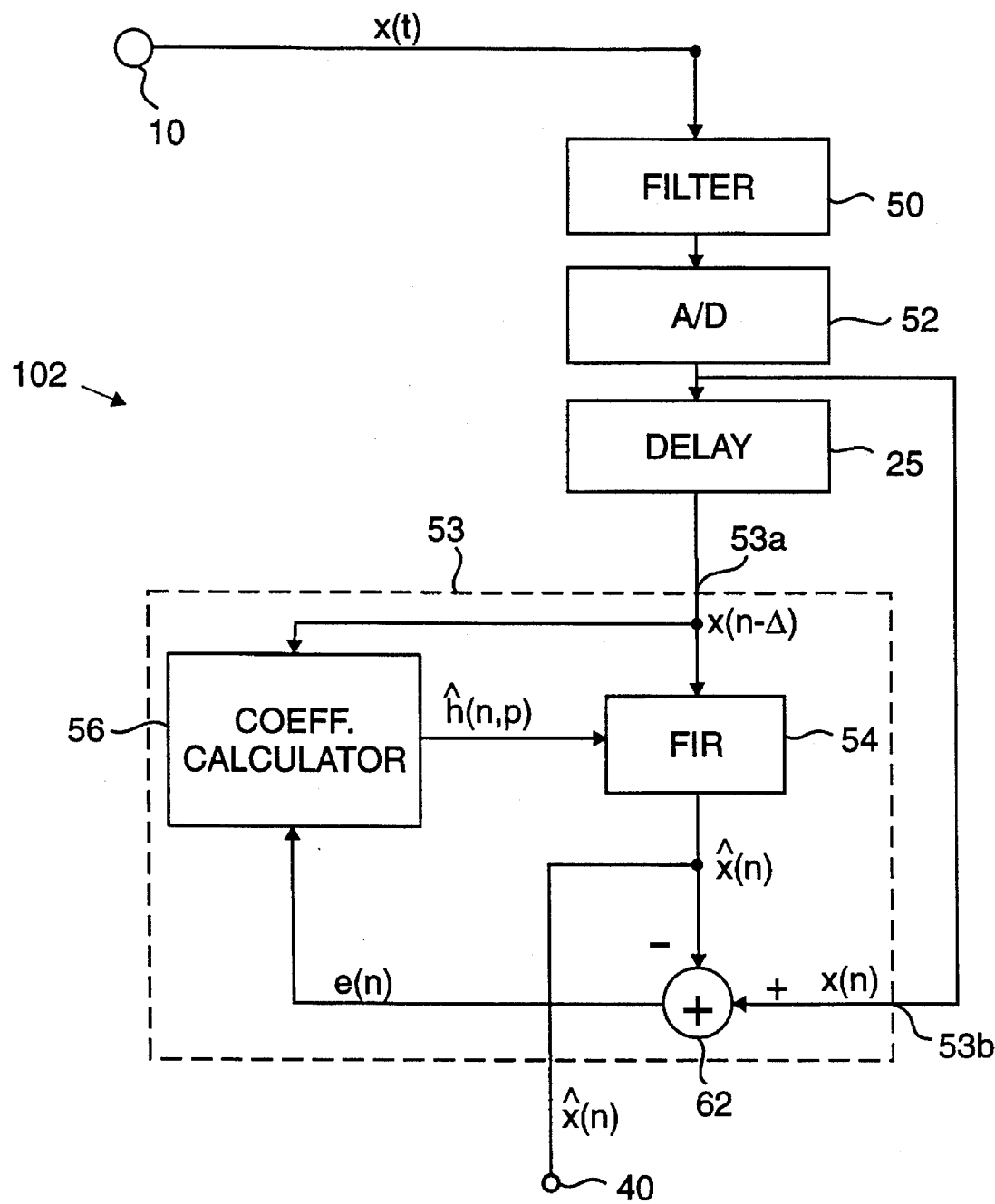
FIG. 3 illustrates a block diagram of a tonal filter operating according to the present invention.

FIG. 3 illustrates another embodiment of the present invention involving the use of the adaptive digital FIR 53 for filtering tonal signals, such as touch-tone dialing tones. This embodiment is referred to as a tonal filter 102. The elements of the tonal filter 102 include the input 10, the filter 50, the A/D converter 52, the adaptive filter 53 and the output 40 from the system in FIG. 1 as well as an added delay element 25.

The input 10 of the tonal filter 102 is connected to the anti-aliasing filter 50, which is in turn connected to the A/D converter 52. The output of the A/D converter 52 is connected to both the delay element 25 and the second input $53b$ of the adaptive FIR filter 53. The delay element 25 is then connected to the first input $53a$ of the adaptive FIR filter 53. The output 40 is connected to the FIR filter 54 of the adaptive filter 53.

The purpose of the tonal filter 53 is to receive noisy tones from a touch-tone dialing device and produce reduced-noise tones. The output signal of the tonal filter is $\hat{y}(n)$, which is referred to in this embodiment as $\hat{x}(n)$ for reasons that will become apparent. The tonal filter 102 is also known as an adaptive line enhancer.

The tonal filter 102 operates in the following manner. An input analog signal composed of a plurality of unknown tones is received at the input 10. The tones may suitably be generated by a remotely-located touch tone dialer, not shown. In any event, the input signal x(t) is contaminated by random line noise. The signal x(t) is then provided to the first anti-aliasing filter 50, and, in turn, to the A/D converter 52. The A/D converter 52 provides the digital input signal x(n) to both the delay 25 and the adaptive filter input $53b$. The delay 25 provides a delayed signal x(n-Δ), where Δ is the duration of the delay, to the first adaptive filter input $53a$. The FIR filter 54 operates to approximate x(n) using the delayed signal x(n-Δ). To this end, the other circuit elements otherwise operate in the manner described above in connection with FIG. 1 to minimize the error signal e(n) created at the summation device 62.

In the operation of the tonal filter 102, however, the delay is chosen to be long enough, preferably longer that the inverse of the highest pass band frequency of the anti-aliasing filter 50, so that the FIR filter 54 and the coefficient calculator 56 cannot correlate the random noise in x(n-Δ) to x(n). Thus, because of the delay, essentially no correlation will exist between the random noise in x(n) and the random noise the delayed signal x(n-Δ). The tones, however, which are relatively constant over much longer time periods, are readily correlated despite the delay. The resulting output signal, $\hat{x}(n)$, comprises the estimated tone signal with the random noise substantially removed. Such tonal filtering techniques are generally known.

The present invention provides an improvement over the prior art tonal filters by allowing the filter to converge more quickly within the frequency band of the tones. In this case, the system's frequency band of interest is defined as the highest frequency tone that may be transmitted. As a consequence, the anti-aliasing filter 50 has a cut-off frequency exceeding the highest frequency tone, preferably by 10 to 25 percent.

The present invention allows the error in $\hat{x}(n)$ to be reduced by increasing the frequency band of operation of the filter 53. As a result, the errors that are concentrated at the band edge of the filter are beyond the highest frequency tone used in the system, and therefore do not inhibit system operation. In this case, a shaving filter to reduce the bandwidth of the output signal is not always necessary, because frequencies higher than the tones are not relevant to the system using the filtered tones. Nevertheless, a filter may be desirable to remove noise that is present in the higher frequencies.

Figure 4:
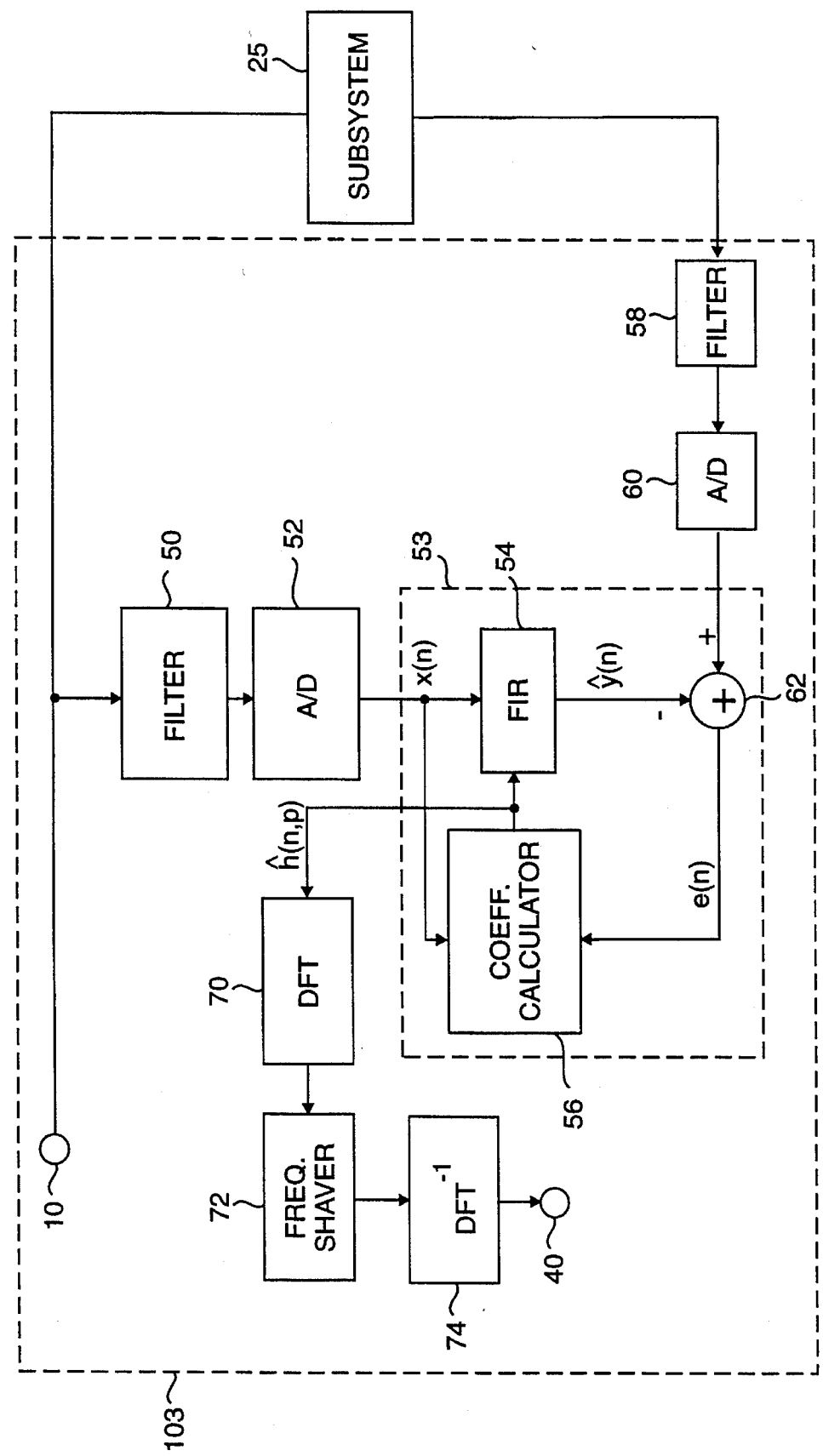
FIG. 4 illustrates a block diagram of an adaptive system identification apparatus operating according to the present invention.

FIG. 4 illustrates yet another embodiment of the present invention in which the adaptive FIR filter 53 is used as part of an adaptive system identification (ASID) apparatus 103. Illustration and description of this embodiment is accomplished through simple modification of the system 100 illustrated in FIG. 1. In this embodiment, the speaker 20 and microphone 30 are replaced by a subsystem 25 having an unknown, time variable impulse response, H(t). The coefficient calculator 56 is further connected to a discrete Fourier transform device 70. This discrete Fourier transform device is then connected to a frequency shaving device 72, which in turn is connected to an inverse discrete Fourier transform device 74. The output 40 is then connected to the inverse discrete Fourier transform device 74.

The ASID apparatus 103 provides an ongoing discrete time estimation of the impulse response, H(t), of the subsystem 25. Therefore, in contrast to other embodiments, the adaptive filter 53 provides the impulse response coefficients, $\hat{H}(n)$, as its output. Such system identification techniques are generally known in the prior art. In the prior art, however, slow asymptotic convergence of the LMS algorithm in the adaptive FIR filter inhibited the ability of prior art system identification devices to react to changes the impulse response H(t) in a timely manner. The method of the present invention provides faster adaptation of $\hat{H}(n)$ to H(t) within the frequency band of interest.

The ASID apparatus 103 operates generally in the same manner as the echo canceller described in connection with FIG. 1. In particular, the ASID apparatus employs the anti-aliasing filters 50 and 58 to expand the frequency band of the adaptive FIR filter input signals. The error signal, however, is not used as an output. In this case, the impulse response coefficients $\hat{h}(n,p)$ for p=0 to P−1 are the output and thus the high frequency components must be shaved or removed therefrom.

To this end, the coefficients $\hat{H}(n)$, which are time domain coefficients, are provided to the discrete Fourier transform device 70 which converts $\hat{H}(n)$ to the frequency domain. Then, the frequency shaving device 72 simply shaves or removes the frequency components or coefficients which exceed the frequency band of interest. The use of a window such as a Hamming window is preferred so that the shaving does not create abrupt edges in the frequency band. In any event, the inverse discrete Fourier transform device 74 may then convert the remaining frequency domain coefficients back to the time domain and provide the resulting impulse response estimate to the output 40.

Therefore, by expanding the frequency band of the signals x(n) and y(n), the slowly converging components of $\hat{H}(n)$ are pushed into frequencies exceeding the frequency band of interest. The slowly converging components of $\hat{H}(n)$ are then cut off in the frequency domain before the final version of $\hat{H}(n)$ is provided to subsequent circuitry.

Another type of echo canceller in which the present invention may provide improvements is a subband acoustic echo canceller. In a subband acoustic echo canceller, the input speech signal x(t) is split into a plurality of subband signals. Each subband signal is then down-sampled and filtered by an adaptive FIR filter. All of the subband signals are thereafter reconstructed into a single full band signal. See U.S. Pat. No. 5,272,695 for a general description of such systems. The advantage of subband echo cancellation is that each adaptive FIR filter must only process a down-sampled portion of the input speech signal x(t). As a result each filter need only perform the adaptive FIR calculations at the reduced, or down-sampled rate.

Figure 5:
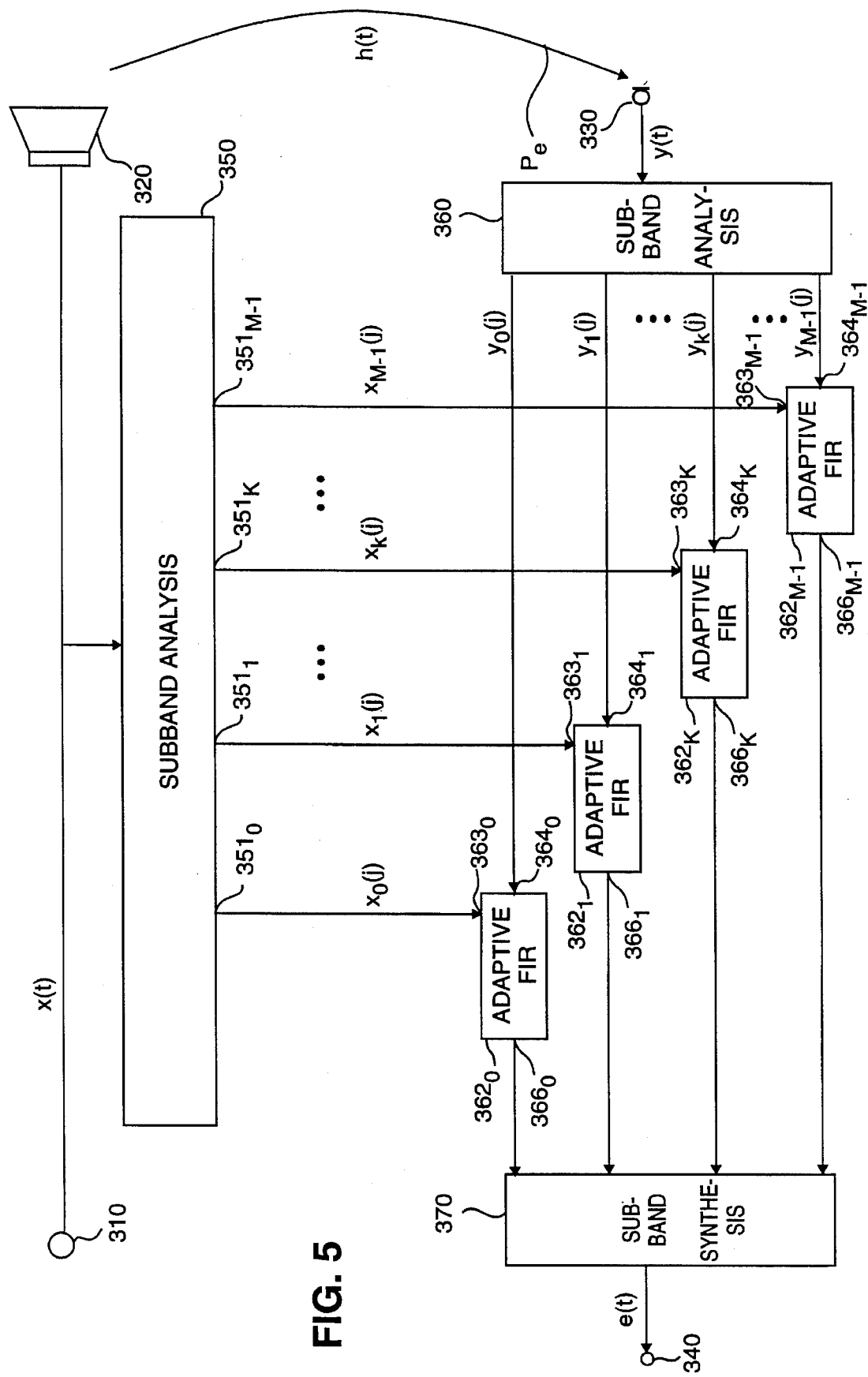
FIG. 5 illustrates a block diagram of a full-duplex hands-free communication system including a subband acoustic echo cancellation apparatus operating according to the present invention.

FIG. 5 illustrates a system employing a subband echo canceller operating according to the principles of the present invention. The system in FIG. 5 includes an input 310, a loudspeaker 320, a microphone 330, an output 340, and a subband echo canceller including first and second subband analyzers 350 and 360, a subband synthesizer 370 and a plurality of adaptive FIR filters $362_0$ through $362_{M-1}$. Each filter $362_K$ further comprises a first input $363_K$, a second input $364_K$ and an output $366_K$.

Figure 6A:
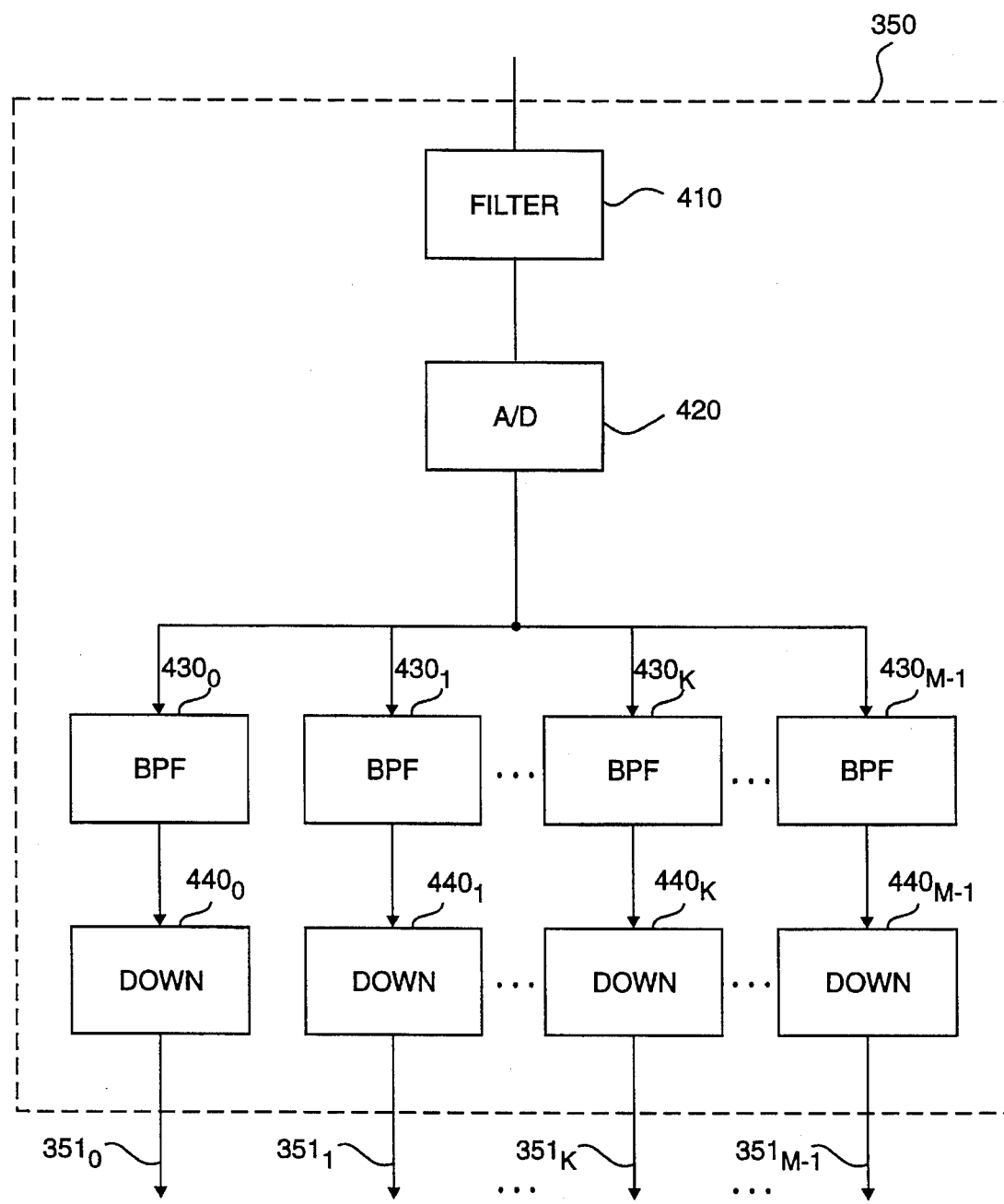
FIG. 6A illustrates a subband analyzer for use in the filter illustrated in FIG. 5.

The input 310 is connected to both the subband analyzer 350 and the loudspeaker 320. The subband analyzer 350 is described in further detail below in connection with FIG. 6A. In FIG. 6A, the subband analyzer includes an anti-aliasing filter 410 connected to an A/D converter 420, which is in turn connected to each of M bandpass filters $430_0$ through $430_{M-1}$. Each bandpass filter $430_K$ is connected to an output $351_K$ of the analyzer 350 through a down-sampler $440_K$.

Figure 7:
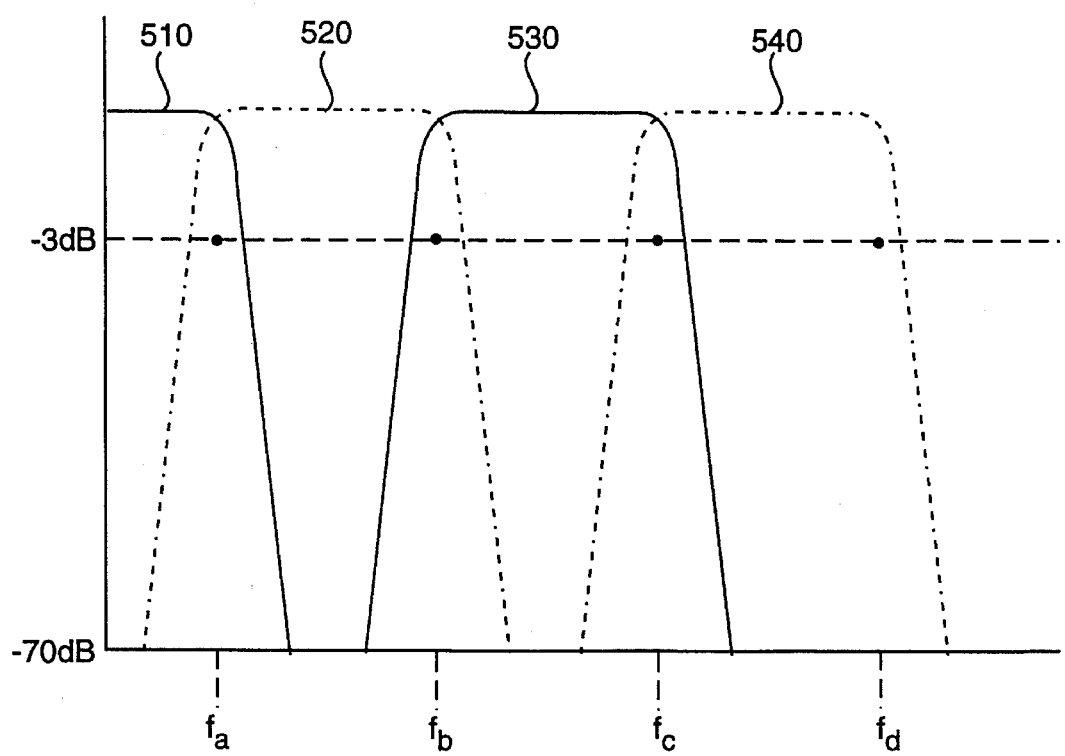
FIG. 7 illustrates the frequency response characteristics of a bank of four subband filters having overlapping pass bands.

The bandpass filters $430_0$ through $430_{M-1}$ of the present invention have pass bands which overlap. By overlapping pass bands, it is meant that the cut-off frequency of one filter is within the pass band of an adjacent filter. FIG. 7 shows the collective frequency response of four exemplary filters having overlapping pass bands. The frequency response shows the frequency band of the four subbands 510, 520, 530 and 540 which may be produced by four filters, $430_0$ through $430_3$, respectively. The first subband 510 decreases to its high frequency −3 db point at a frequency higher than the frequency at which the second subband 520 increases to its low frequency −3 db point. Likewise, the second subband 520 decreases to its high frequency −3 db point at a higher frequency than the frequency at which the third subband 530 increases to its low frequency −3 dB point, and so forth. The bandpass filters preferably overlap up to 20 percent of their pass bands.

Figure 8:
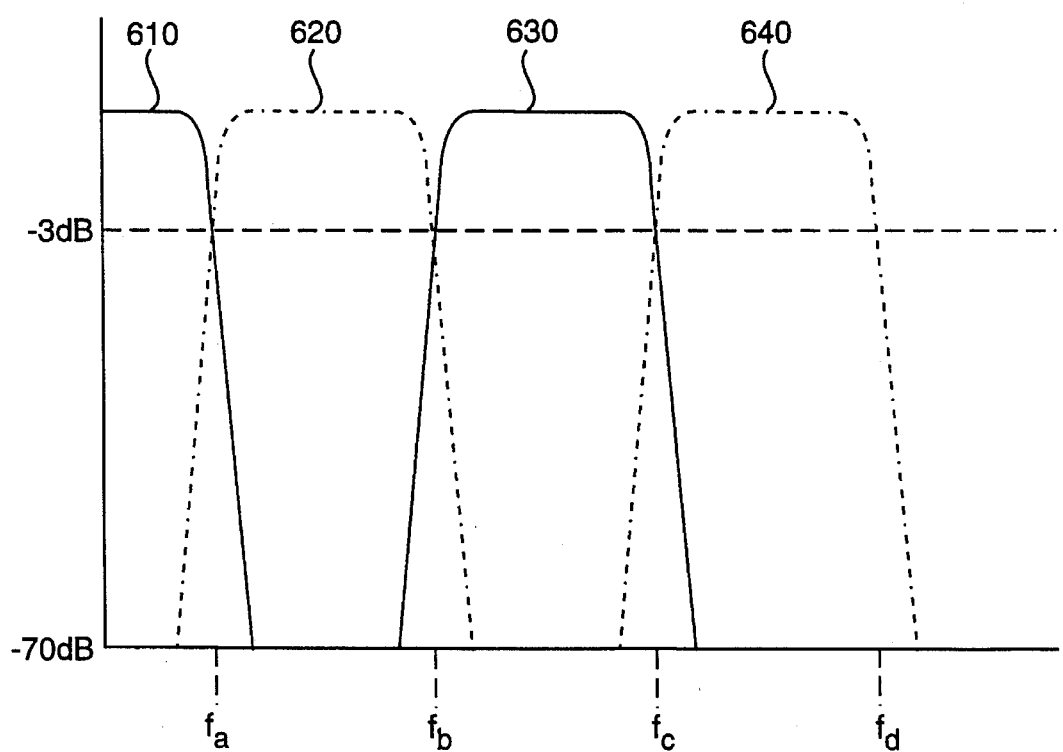
FIG. 8 illustrates the frequency response characteristics of a bank of four subband filters having non-overlapping pass bands.

In contrast, FIG. 8 shows the frequency response of four bandpass filters having non-overlapping frequency bands. The first filter's frequency response, represented by the curve 610, drops to its high frequency −3 dB point at the same frequency as the second filter's frequency response, represented by the curve 620 rises to its low frequency −3 dB point. Likewise, the second filter's frequency response, represented by the curve 620, drops to its high frequency −3 dB point at the same frequency as the third filter's frequency response, represented by the curve 530, rises to its low frequency −3 dB point.

Prior art subband analyzers employ bandpass filters having non-overlapping frequency bands such as those illustrated in FIG. 8. The modification of such filters to provide overlapping frequency bands is readily accomplished by those of ordinary skill in the art.

Returning to FIG. 5, each subband analyzer output $351_K$ is connected to the first input $363_K$ of the corresponding adaptive FIR filter $362_K$. The adaptive FIR filters $362_0$ through $362_{M-1}$ may suitably have the same structure and operation as the filter 53 illustrated in FIG. 2 above. The adaptive FIR filters $362_0$ through $362_{M-1}$, however, may employ less coefficients or taps because of their reduced bandwidth of operation.

The microphone 330 is connected to the second subband analyzer 360. The second subband analyzer 360 has M outputs, each connected to one of the second adaptive filter inputs $364_0$ through $364_{M-1}$. The analyzer 360 is preferably substantially of the same structure and operation as the first subband analyzer 350. The adaptive filter outputs $366_0$ through $366_{M-1}$ are each connected to one of M inputs to the subband synthesizer 370. The output of the subband synthesizer is the circuit output 340.

Figure 6B:
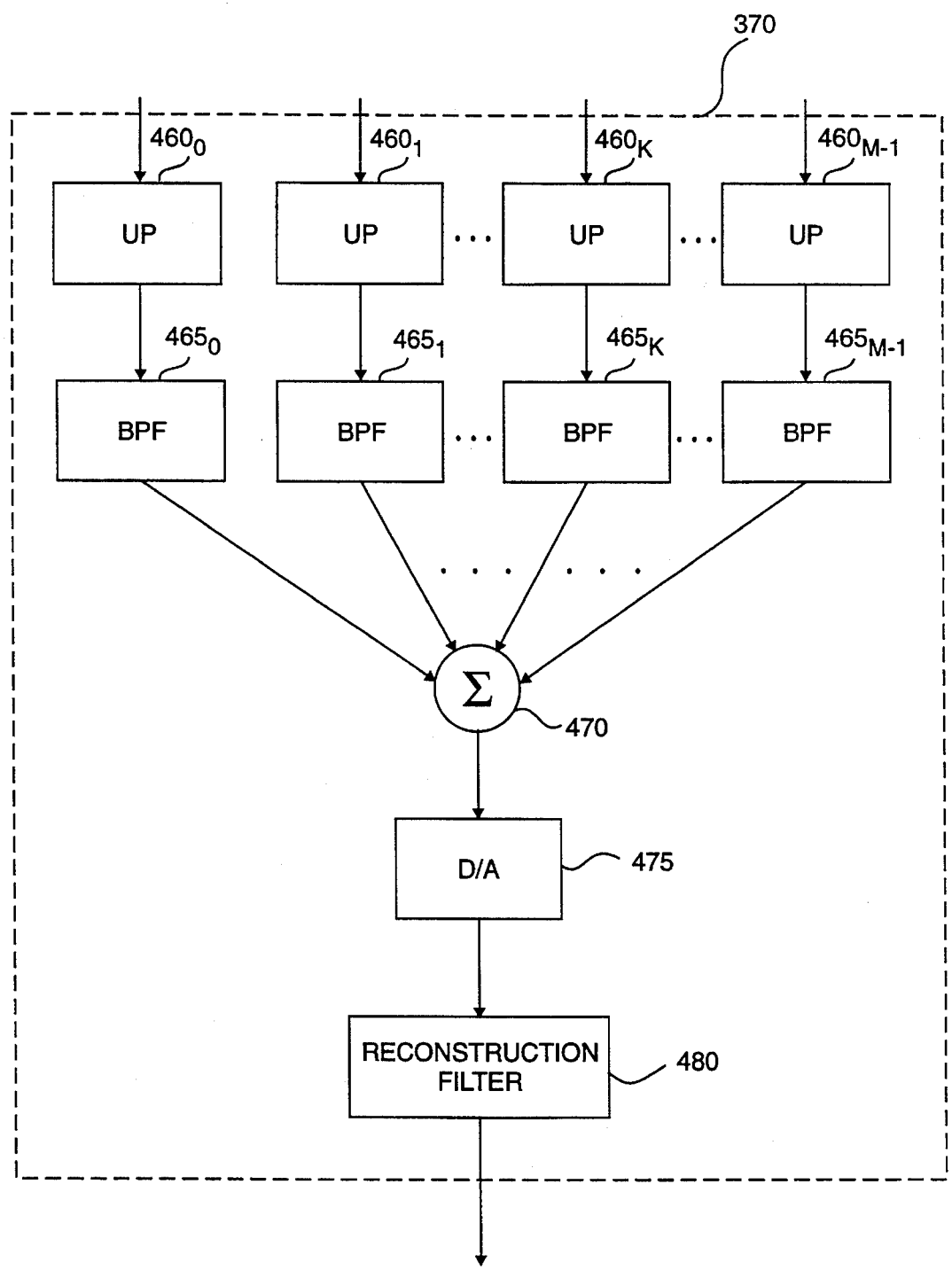
FIG. 6B illustrates a subband synthesizer for use in the filter illustrated in FIG. 5.

The subband synthesizer is shown in greater detail in FIG. 6B, and includes M up-samplers $460_0$ through $460_{M-1}$, M bandpass filters $465_0$ through $465_{M-1}$, a summation device 470, a digital-to-analog (D/A) converter 475 and a reconstruction filter 480. Each of the M inputs of the synthesizer 370 are connected to one of the up-samplers $460_K$. Each up-sampler $460_K$ is connected to the corresponding bandpass filter $465_K$. All of the bandpass filters $465_0$ through $465_{M-1}$ are connected to the summation device 470. The D/A converter 475 is connected between the summation device 470 and the reconstruction filter 480.

In the subband synthesizer 370, however, the pass band of adjacent filters do not overlap. Instead, the −3 db points of the pass bands of adjacent bandpass filters intersect. For example, FIG. 8 shows the frequency response which may be generated by four subband synthesis filters having non-overlapping pass bands. Suitable up-samplers and bandpass filters are well-known.

The above-discussed components operate in the following manner to provide acoustic echo cancellation. As was the case with the system illustrated in FIG. 1, an analog speech input signal x(t) is provided at the input 310. The signal x(t) traverses the echo path $P_e$ from the speaker 320 to the microphone 330. The echo path $P_e$ may be modeled as a filter having a time variable impulse response, H(t).

The signal x(t) is also provided to the subband analyzer 350. In the subband analyzer, x(t) is digitized and divided into a plurality of M subbands. Referring to FIG. 4(a), the signal x(t) is first filtered by the anti-aliasing filter 410 and then sampled at a rate appropriate for the anti-aliasing filter 410. As before, the anti-aliasing filter 410 and the A/D converter 420 should preferably be chosen such that the sampling rate is at least twice the frequency at which the filter 410 provides 70 dB of attenuation. The sampled signal x(n) is then bandlimited by each bandpass filter $430_K$, producing M subband signals, $x_0(n)$ through $x_{M-1}(n)$.

Referring again to FIG. 6A, the filtered signals $x_0(n)$, $x_1(n)$, ..., $x_{M-1}(n)$ are then provided to the down-samplers $440_0$ through $440_{M-1}$. Each down-sampling circuit $440_K$ extracts every jth sample to produce a signal $x_K(j)$. The down sampling factor is chosen such that the effective sampling rate exceeds twice the extended bandwidth of each subband, where the extended band width is the band between low and high −70 db attenuation frequencies, and the effective sampling rate is the original sampling rate divided by the down-sampling factor.

For example, consider an echo canceller used in a hands-free telephone device wherein the nominal sampling rate is 8000 Hz. If the filter $430_1$ produces the subband 520 from FIG. 7 having a low frequency −70 dB point at 400 Hz and its high frequency −70 dB point at 1600 Hz, then the effective sampling rate must be at least two times 1200, or 2400 samples per second. As a result, the down-sampling factor must be no more than 8000/2400 or 3.333. The down-sampling factor should be chosen to be the highest integer that does not exceed the threshold. Consequently, the down-sampling factor in this example would be chosen to be 3.

Each of the down-sampled subband signals, $X_K(j)$ are then provided to the corresponding analyzer output $351_K$. It should be noted that if the digital bandpass filters comprise complex digital filters, which are well known, then the down-sampling factor must be chosen such that the effective sampling rate is at least the extended bandwidth of each subband, instead of twice the extended bandwidth.

Returning to FIG. 5, each signal $x_K(j)$ is then provided to the corresponding adaptive FIR filter $362_K$.

While the input signal x(t) is being processed by the subband analyzer 350, the input signal x(t) also audibly traverses the path $P_e$, which may be modeled as a filter having an impulse response H(t), producing a signal y(t) at the microphone 330. The microphone 330 provides y(t) to the second subband analyzer 360. The second subband analyzer 360 performs the same operations on the signal y(t) as the first subband analyzer 350 performed on x(t), producing a series of down-sampled, subband signals $y_0(j)$ through $y_{M-1}(j)$.

The second subband analyzer provides each signal $y_K(j)$ to the second input $364_K$ of the corresponding adaptive FIR filter $362_K$. The adaptive FIR filter $362_K$ then operates to suppress the echo signal $y_K(j)$ and generate an error signal $e_K(j)$ corresponding to each subband. The error signal $e_K(j)$ is then provided to the subband synthesizer 370.

The operations of the adaptive FIR filters $362_0$ through $362_{M-1}$ are the same as those of the filter 53 illustrated in FIG. 1. The only difference is that each adaptive FIR filter $362_K$ only operates on a portion of the bandwidth of interest of the system. The reduced bandwidth reduces the relative computation level of the adaptive filter.

The subband synthesizer 370 thereafter performs the converse of the operations of the subband analyzers 350 and 360, in other words, it combines the subbands into a single fullband signal. Referring to FIG. 6B, each signal $e_K(j)$ is up-sampled by up-sampler $460_K$ and then passed through the corresponding bandpass filter $465_K$.

The filtered, up-sampled signals are then provided to the summation device 470 which constructs a full band digital error signal e(n). The signal e(n) is thereafter provided to the D/A converter 475 and to the reconstruction or smoothing filter 480.

In this embodiment, each of the M adaptive FIR filters operates according to the principles discussed in connection with FIG. 1. This embodiment of the present invention reduces the error due to slow asymptotic convergence by broadening the band of the signals entering each adaptive filter and then filtering out the broadened portion before the full-band signal is reconstructed. This is accomplished by using bandpass filters in the analyzers 350 and 360 which have a wider pass band than the corresponding bandpass filters in the subband synthesizer 370. Accordingly, for the kth subband, the frequency band of interest may be thought of as the pass band of the subband synthesis bandpass filter $465_K$. Again, this shaving technique removes the slowly converging components that are concentrated at the band edges. It has been found experimentally that by increasing the overlap, and thus the corresponding band width of each subband, the more the convergence error is reduced.

It is to be understood that the above-described embodiments of the invention are merely illustrative. Other implementations may readily be devised by those skilled in the art which will embody the principles of the invention and fall within the spirit and scope thereof. For example, the subband architecture discussed in connection with FIG. 5 may readily be adapted to other adaptive filter systems such as the tonal filter illustrated in FIG. 3 or the ASID apparatus illustrated in FIG. 4. Furthermore, the present invention may readily be employed in conjunction with other methods of improving the slow convergence such as the whitening filter method, discussed above.

We claim:

1. A signal processing apparatus for use in a system having a predetermined frequency band of interest, the signal processing apparatus comprising:
   a) a first means for receiving a first signal in the predetermined frequency band of interest and converting the first signal into a first input signal having a first operating bandwidth that exceeds the predetermined frequency band of interest;
   b) a second means for receiving a second signal in the predetermined frequency band of interest and converting the second signal into a second input signal having the first operating bandwidth;
   c) a first input operable to receive the first input signal and a second input operable to receive the second input signal;
   d) an adaptive finite impulse response filter connected to the first input and the second input, said filter operable to
      produce coefficients defining an impulse response, said impulse response representative of a relationship between the first input signal and the second input signal,
      process the first input signal using the impulse response and produce an estimated signal therefrom,
      produce an error signal representative of the difference between the estimated signal and the second input signal, and
      generate an output signal corresponding to the first input signal;
   wherein said signal processing apparatus is operable to provide the output signal to the system, said output signal having reduced error resulting from slow asymptotic convergence in the predetermined frequency band of interest.

2. The signal processing apparatus of claim 1 wherein the adaptive finite impulse response filter is further operable to produce coefficients defining the impulse response using a least mean squares algorithm.

3. The signal processing apparatus of claim 1 wherein the signal processing apparatus is employed in an acoustic echo cancellation apparatus and wherein the output signal comprises the error signal.

4. The signal processing apparatus of claim 1 wherein the signal processing apparatus is employed in a line echo cancellation apparatus and wherein the output signal comprises the error signal.

5. The signal processing apparatus of claim 1 wherein the signal processing apparatus is employed in a tonal filter apparatus and wherein the output signal comprises the estimated signal.

6. The signal processing apparatus of claim 1 wherein the signal processing apparatus is employed in an adaptive system identification apparatus and wherein the output signal comprises the coefficients defining the impulse response.

7. The signal processing apparatus of claim 1 wherein the signal processing apparatus is employed in a subband echo cancellation apparatus and wherein the output signal comprises the error signal.

8. The signal processing apparatus of claim 1, wherein said first means further comprises:
   an A/D converter operably connected to provide the first input signal to the first input; and
   a low pass filter operably connected to receive the first signal and to provide a filtered analog speech signal to the A/D converter, said filter having a pass band corresponding to the first operating bandwidth.

9. The signal processing apparatus of claim 8, wherein the low pass filter has a cutoff frequency of about 4 kHz and the predetermined frequency band of interest is from 0–3.5 kHz.

10. The signal processing apparatus of claim 9, wherein the A/D converter has a sampling rate which exceeds twice the cutoff frequency of the low pass filter.

11. The signal processing apparatus of claim 10, wherein the A/D converter has a sampling rate which is at least twice the frequency at which the low pass filter exhibits −70 dB of attenuation.

12. The signal processing apparatus of claim 1, wherein the first operating bandwidth has an upper frequency which is between 10 and 25 percent higher than the upper frequency of the predetermined frequency band of interest.

13. The signal processing apparatus of claim 1 further comprising a reconstruction filter having a cutoff lower than the first operating bandwidth.

14. The signal processing apparatus of claim 13 further comprising a digital to analog converter connected to receive the error signal and produce an output to said reconstruction filter.

15. A signal processing apparatus comprising:
   a) a first means for receiving a first signal in the predetermined frequency band of interest and converting the first signal into a first input signal having a first operating bandwidth that exceeds the predetermined frequency band of interest;
   b) a second means for receiving a second signal in the predetermined frequency band of interest and converting the second signal into a second input signal having the first operating bandwidth;
   c) a first input operable to receive the first input signal and a second input operable to receive the second input signal, the first and second input signals having a first operating bandwidth;
   d) an adaptive finite impulse response filter connected to the first input and the second input, said filter operable to
      produce coefficients defining an impulse response, said impulse response representative of a relationship between the first input signal and the second input signal,
      process the first input signal using the impulse response and produce an estimated signal therefrom,
      produce an error signal representative of the difference between the estimated signal and the second input signal, and
      generate an output signal corresponding to the first input signal; and
   e) a shaving device connected to receive the output signal from the adaptive finite impulse response filter, said shaving device operable to generate a processed signal therefrom, the processed signal having a second operating bandwidth which is less than said first operating bandwidth.

16. The signal processing apparatus of claim 15 wherein the adaptive finite impulse response filter is further operable to produce coefficients defining the impulse response using a least mean squares algorithm.

17. The signal processing apparatus of claim 15 wherein the second input signal represents the first input signal subjected to a acoustic echo path and the output signal comprises the error signal.

18. The signal processing apparatus of claim 15 wherein the first input signal represents the second input signal subjected to an line echo path and the output signal comprises the error signal.

19. The signal processing apparatus of claim 15 wherein the second input signal represents the first input signal subjected to a delay and the output signal comprises the estimated signal.

20. The signal processing apparatus of claim 15 wherein the second input signal represents the first input signal subjected to a subsystem having an unknown response and the output signal comprises the coefficients defining the impulse response.

21. The signal processing apparatus of claim 15 wherein the shaving device further comprises a low pass filter.

22. The signal processing apparatus of claim 15 wherein the shaving device further comprises a band pass filter.

23. The signal processing apparatus of claim 15 wherein the shaving device further comprises:
a discrete Fourier transform device operably connected to the output signal;
a coefficient shaving device operably connected to the discrete Fourier transform device; and
an inverse discrete Fourier transform device operably connected to the coefficient shaving device.

24. The signal processing system of claim 15 further comprising:
an A/D converter operably connected to provide the first input signal to the first input; and
a filter operably connected to provide a filtered speech signal to the A/D converter, said filter having a pass band equal to the first bandwidth.

25. A signal processing apparatus comprising:
a) a first low pass filter operable to receive a first input signal, the first low pass filter having a cutoff at a first frequency;
b) a second low pass filter operable to receive a second input signal, the second low pass filter having a cutoff at the first frequency;
c) a first A/D converter connected to the first low pass filter;
d) a second A/D converter connected to the second low pass filter;
e) an adaptive finite impulse response filter comprising
a coefficient calculator connected to the first A/D converter operable to produce coefficients defining an impulse response, said impulse response representative of the relationship between the first input signal and the second input signal, said coefficients depending on the first input signal and an error signal;
an FIR filter connected to the first A/D converter and further operably connected to receive the coefficients from the coefficient calculator, said FIR filter operable to process the first input signal using the impulse response and produce a simulated signal therefrom;
a summation device connected to the second A/D converter and the FIR filter, the summation device operable to produce the error signal, said error signal representative of the difference between the simulated signal received from the FIR filter and the signal received from the second A/D converter, said summation device further operably connected to provide the error signal to the coefficient calculator; and
f) a shaving filter connected to receive an output signal from the adaptive finite impulse response filter and generate a processed signal therefrom, the filter having a cutoff at a second frequency which is lower than the first frequency.

26. A signal processing apparatus comprising:
a) a first subband analyzer operable to receive a first input signal and produce a plurality of first subband input signals, each first subband signal having a frequency bandwidth that overlaps a frequency bandwidth of another first subband signal;
b) a second subband analyzer operable to receive a second input signal and produce a plurality of second subband input signals, each second subband signal having a frequency bandwidth that overlaps a frequency bandwidth of another second subband signal;
c) a plurality of adaptive finite impulse response filters, each filter comprising
an adaptive finite impulse response filter connected to the first input and the second input, said filter operable to
produce coefficients defining an impulse response, said impulse response representative of a relationship between the first input signal and the second input signal,
process the first input signal using the impulse response and produce an estimated signal therefrom, and
produce an error signal representative of the difference between the estimated signal and the second input signal;
d) a subband synthesizer connected to receive the plurality of subband error signals, said subband synthesizer including a filter operable to reduce the bandwidth of each subband error signal.

27. A method of reducing error for use in a communication system, said system having a predetermined frequency band of interest, the method comprising:
a) receiving a first signal in the predetermined frequency band and generating a first input signal having an operation bandwidth exceeding said predetermined frequency band;
b) receiving a second signal in the predetermined frequency band and generating a second input signal having an operation bandwidth exceeding said predetermined frequency band;
c) providing the first input signal to an adaptive finite impulse response filter;
d) providing the second input signal to the adaptive finite impulse response filter;
e) iteratively generating an impulse response associated with the adaptive finite impulse response filter, said impulse response approximating the relationship between the first input signal and the second input signal; and f) generating an output signal based upon the impulse response and providing said output signal to the system;

wherein the system only uses the portion of the output signal that is within the frequency band of interest.

28. The method of claim 27 further comprising:

g) removing from the output signal any frequency components exceeding the frequency band of interest.

29. The method of claim 28 wherein the method of processing the signal further comprises providing acoustic echo cancellation and the second signal is an echo signal.

30. The method of claim 28 wherein the method of processing the signal further comprises providing line echo cancellation and the second signal is an echo signal.

31. The method of claim 28 wherein step e) further comprises providing the output signal to a filter having a pass band substantially equivalent to the frequency band of interest.

32. The method of claim 27 wherein the method of processing the signal further comprises providing tonal filtering to the signal and the first input signal comprises a delayed version of the second input signal.

33. The method of claim 27 wherein the step of receiving a first signal further comprises:

providing the first signal to a first filter having a pass band exceeding the frequency band of interest.

34. A method of processing a signal for use in a system, the system having a predetermined frequency band of interest, the method comprising:

a) providing a first signal to a first filter, the first filter having a first pass band and producing a first input signal at its output;

b) providing a second input signal to a second filter, the second filter having the first pass band and producing a second input signal at its output;

c) providing the first input signal to an adaptive finite impulse response filter, said filter having an impulse response that approximates the relationship between the first input signal and the second input signal;

d) employing said filter to generate an output signal; and e) providing the output signal to a shaving filter, the shaving filter having a second pass band, the second pass band having less bandwidth than the first pass band.

35. The method of claim 34 further comprising a step of converting the first filtered input signal into a digital signal prior to providing the first filtered input signal to the adaptive finite impulse response filter.

36. The method of claim 34 further comprising a step of converting the first input signal into a digital signal prior to providing the first filtered input signal to the first filter.

* * * * *